(12) United States Patent
Cho et al.

(10) Patent No.: US 9,515,014 B2
(45) Date of Patent: Dec. 6, 2016

(54) POWER CONVERTER PACKAGE WITH INTEGRATED OUTPUT INDUCTOR

(71) Applicant: Infineon Technologies Americas Corp., El Segundo, CA (US)

(72) Inventors: Eung San Cho, Torrance, CA (US); Dan Clavette, Greene, RI (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/855,665

(22) Filed: Sep. 16, 2015

(65) Prior Publication Data
US 2016/0104665 A1 Apr. 14, 2016

Related U.S. Application Data

(60) Provisional application No. 62/061,623, filed on Oct. 8, 2014.

(51) Int. Cl.
| | |
|---|---|
| *H01L 23/34* | (2006.01) |
| *H01L 23/495* | (2006.01) |
| *H01L 23/66* | (2006.01) |
| *H01L 49/02* | (2006.01) |
| *H01L 29/778* | (2006.01) |
| *H02M 3/158* | (2006.01) |

(52) U.S. Cl.
CPC ......... *H01L 23/49575* (2013.01); *H01L 23/66* (2013.01); *H01L 28/10* (2013.01); *H01L 29/7787* (2013.01); *H02M 3/158* (2013.01); *H02M 3/1588* (2013.01); *H01L 2224/45147* (2013.01); *H01L 2224/48091* (2013.01); *H01L 2224/73265* (2013.01); *H01L 2924/181* (2013.01); *H01L 2924/19107* (2013.01)

(58) Field of Classification Search
CPC ............... H01L 23/66; H01L 23/49575; H01L 29/7787; H01L 28/10
USPC ................................. 257/666, 676, 724, 528
See application file for complete search history.

(56) References Cited

U.S. PATENT DOCUMENTS 8,149,064 B2 * 4/2012 Paul ...................... H01L 23/645
257/315
2011/0134613 A1 6/2011 Moussaoui
2011/0210708 A1 9/2011 Herbsommer
(Continued)

OTHER PUBLICATIONS

Extended Search Report from counterpart European Application No. 15185987.3, dated Feb. 23, 2016, 6 pp.

*Primary Examiner* — Nitin Parekh
(74) *Attorney, Agent, or Firm* — Shumaker & Sieffert, P.A.

(57) ABSTRACT

In one implementation, a semiconductor package includes a first patterned conductive carrier including partially etched segments. The semiconductor package also includes a control FET having a control drain attached to a first partially etched segment of the first patterned conductive carrier. In addition, the semiconductor package includes a sync FET having a sync source and a sync gate attached to respective second and third partially etched segments of the first patterned conductive carrier. The semiconductor package further includes a second patterned conductive carrier having a switch node segment situated over a control source of the control FET and over a sync drain of the sync FET, as well as an inductor coupled between the switch node segment and an output segment of the second patterned conductive carrier.

19 Claims, 8 Drawing Sheets

(56) References Cited

U.S. PATENT DOCUMENTS

| | | | |
|---|---|---|---|
| 2011/0228507 A1 | 9/2011 | Yin | |
| 2012/0119343 A1* | 5/2012 | Bayan | H01L 21/4842 257/676 |
| 2012/0194148 A1 | 8/2012 | Yiu | |
| 2012/0200281 A1 | 8/2012 | Herbsommer | |
| 2012/0326287 A1* | 12/2012 | Joshi | H01L 23/49548 257/676 |
| 2013/0249051 A1 | 9/2013 | Saye | |
| 2013/0256859 A1* | 10/2013 | Cho | H01L 23/49524 257/676 |
| 2014/0110796 A1* | 4/2014 | Cho | H01L 24/92 257/401 |
| 2014/0110863 A1* | 4/2014 | Cho | H01L 24/32 257/777 |
| 2014/0133186 A1* | 5/2014 | Balakrishnan | H02M 3/33523 363/17 |
| 2014/0306332 A1* | 10/2014 | Denison | H01L 24/36 257/676 |
| 2015/0001599 A1* | 1/2015 | Cho | H01L 23/3121 257/288 |

\* cited by examiner

POWER CONVERTER PACKAGE WITH INTEGRATED OUTPUT INDUCTOR

The present application claims the benefit of and priority to a provisional application entitled "Package with Inductor on Powerstage," Ser. No. 62/061,623 filed on Oct. 8, 2014. The disclosure in this provisional application is hereby incorporated fully by reference into the present application.

BACKGROUND

Background Art

Power converters, such as voltage regulators, are used in a variety of electronic circuits and systems. Many integrated circuit (IC) applications, for instance, require conversion of a direct current (DC) input voltage to a lower, or higher, DC output voltage. For example, a buck converter may be implemented to convert a higher voltage DC input to a lower voltage DC output for use in low voltage applications in which relatively large output currents are required.

The output stage of a power converter typically includes a high side control transistor and a low side synchronous (sync) transistor, and may include a relatively large output inductor. In addition, power converter circuitry typically includes a driver IC designed to drive the control and/or sync transistors of the output stage. Consequently, packaging solutions for a power converter typically require printed circuit board (PCB) area sufficient to accommodate a side-by-side layout including not only the control and sync transistors of the power converter output stage, but the output inductor and the driver IC for the output stage as well.

SUMMARY

The present disclosure is directed to a power converter package with integrated output inductor, substantially as shown in and/or described in connection with at least one of the figures, and as set forth in the claims.

DETAILED DESCRIPTION

Figure 1:
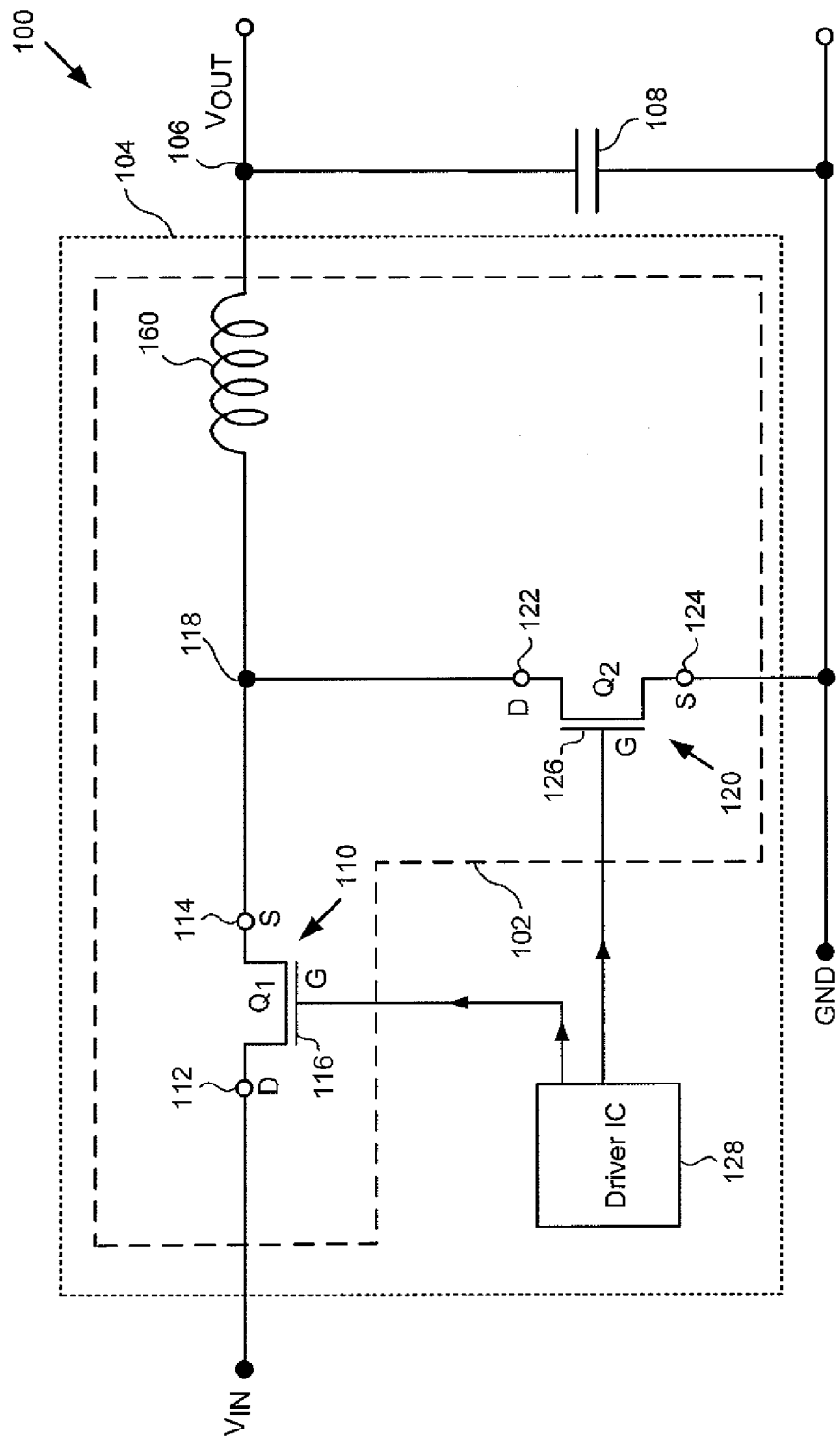
FIG. 1 shows a diagram of an exemplary power converter.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, power converters, such as voltage regulators, are used in a variety of electronic circuits and systems. For instance, integrated circuit (IC) applications may require conversion of a direct current (DC) input voltage to a lower, or higher, DC output voltage. As a specific example, a buck converter may be implemented as a voltage regulator to convert a higher voltage DC input to a lower voltage DC output for use in low voltage applications in which relatively large output currents are required.

FIG. 1 shows a diagram of an exemplary power converter. Power converter 100 includes power converter package 104 and output capacitor 108. As shown in FIG. 1, power converter package 104 includes output stage 102 of power converter 100, and driver IC 128 providing drive signals to output stage 102. As further shown in FIG. 1, power converter 100 is configured to receive an input voltage $V_{IN}$, and to provide a converted voltage, e.g., a rectified and/or stepped down voltage, as $V_{OUT}$ at output 106.

Output stage 102 may be implemented using two power switches in the form of metal-oxide-semiconductor field-effect transistors (MOSFETs) configured as a half bridge, for example. That is to say, output stage 102 may include high side or control FET 110 ($Q_1$) having drain 112, source 114, and gate 116, as well as low side or synchronous (sync) FET 120 ($Q_2$) having drain 122, source 124, and gate 126. In addition, output stage 102 of power converter package 104 includes integrated output inductor 160. As shown in FIG. 1, control FET 110 is coupled to sync FET 120 at switch node 118, which, in turn, is coupled to output 106 through output inductor 160. Respective control and sync FETs 110 and 120 may be implemented as group IV based power FETs, such as silicon power MOSFETs having a vertical design, for example. Power converter 100 may be advantageously utilized, for example as a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power FET may be fabricated using gallium nitride (GaN), in which the group III element or elements include some or a substantial amount of gallium, but may also include other group III elements in addition to gallium. Thus, in some implementations, one or both of control FET 110 and sync FET 120 may take the form of a III-Nitride power FET, such as a III-Nitride high electron mobility transistor (HEMT).

Figure 2:
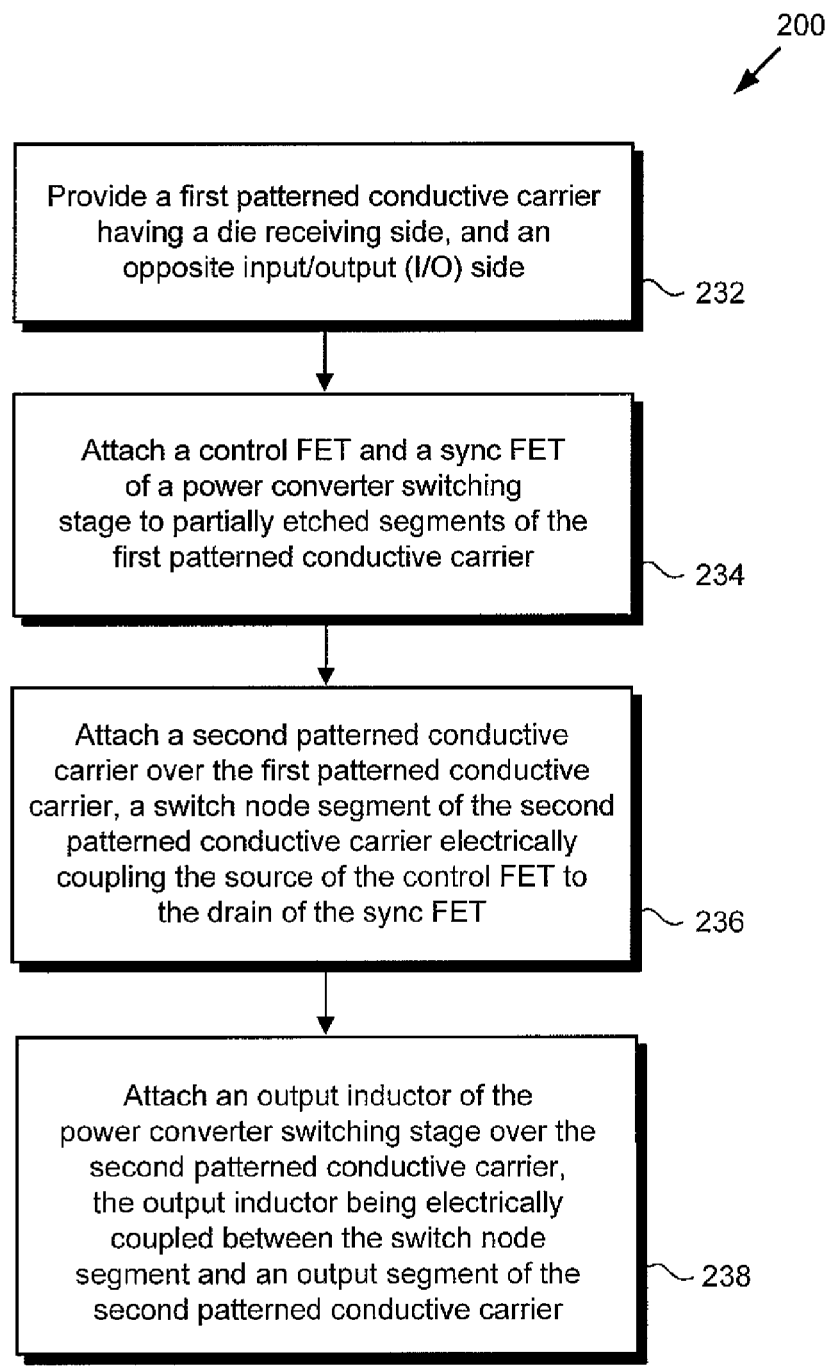
FIG. 2 shows a flowchart presenting an exemplary method for fabricating a power converter package with integrated output inductor, according to one implementation.

Continuing to FIG. 2, FIG. 2 shows flowchart 200 presenting an exemplary method for fabricating a power converter package with integrated output inductor. The exemplary method described by flowchart 200 is performed on a portion of a conductive carrier structure, which may be a semiconductor package lead frame, or may take the form of a conductive sheet or plate, for example.

Figure 3A:
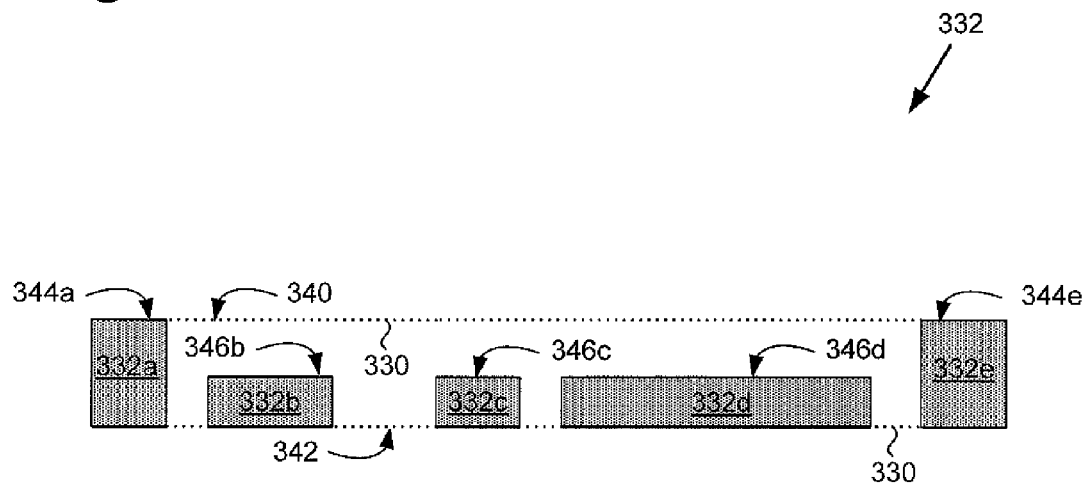
FIG. 3A illustrates a result of performing an initial action according to the exemplary flowchart of FIG. 2 in accordance with one implementation.

With respect to FIGS. 3A-3D, structures 332, 334, 336, and 338 shown respectively in those figures illustrate the result of performing the method of flowchart 200, according to one implementation. For example, FIG. 3A represents first patterned conductive carrier 332 including segments 332a, 332b, 332c, 332d, and 332e (hereinafter "segments 332a-332e"), and having die receiving side 340 and opposite input/output (I/O) side 342 (action 232). Structure 334 shows first patterned conductive carrier 332 after attachment of a control FET and a sync FET to partially etched segments 332d, 332b, and 332c (action 234). Structure 336 shows structure 334 after attachment of a second patterned conductive carrier (action 236), and so forth.

Referring to flowchart 200, in FIG. 2, in combination with FIG. 3A, flowchart 200 begins with providing first patterned conductive carrier 332 having die receiving side 340, and opposite I/O side 342 (action 232). As shown in FIG. 3A, first patterned conductive carrier 332 may be a fully patterned conductive carrier including conductive carrier segments 332a-332e. As further shown in FIG. 3A, first patterned conductive carrier 332 is shown to have surfaces 344a and 344e on respective segments 332a and 332e, as well as recessed surfaces 346b, 346c, and 346d on respective partially etched segments 332b, 332c, and 332d. Partially etched segments 332b, 332c, and 332d may be half-etched, for example, while segments 332a and 332e may be substantially non-etched.

It is noted that segments 332a-332e are shown as connected by dashed lines 330 to indicate that the gaps between those respective segments may be visible in FIGS. 3A-3D due to patterning of an initially contiguous conductive carrier structure providing first patterned conductive carrier 332. That is to say, first patterned conductive carrier 332 may be provided by a single conductive carrier support structure, fully patterned to provide segments 332a-332e. First patterned conductive earlier 332 may be faulted of any conductive material having a suitably low electrical resistance. Examples of materials from which first patterned conductive carrier 332 may be formed include copper (Cu), aluminum (Al), or a conductive alloy. In one implementation, as noted above, first patterned conductive carrier 332 may be implemented using at least a portion of a semiconductor package lead frame.

Recessed surfaces 346b, 346c, and 346d on die receiving side 340 of first patterned conductive carrier 332 may be the result of a partial etch performed on die receiving side 340, resulting in formation of partially etched segments 332b, 332c, and 332d. In one implementation, for example, recessed surfaces 346b, 346c, and 346d may be produced by performing a half-etch of portions of patterned conductive carrier 332, on die receiving side 340, to form half-etched segments corresponding to partially etched segments 332b, 332c, and 332d.

Although not shown in the present figures, in some implementations, patterned conductive carrier 332 may include a barrier metal layer formed on one or both of die receiving side 340 and I/O side 342. Such a barrier metal layer may be formed of nickel-gold (NiAu) or nickel-palladium-gold (NiPdAu), for example. In some implementations, such a barrier metal layer may serve as an etching mask during patterning of first patterned conductive carrier 332.

Figure 3B:
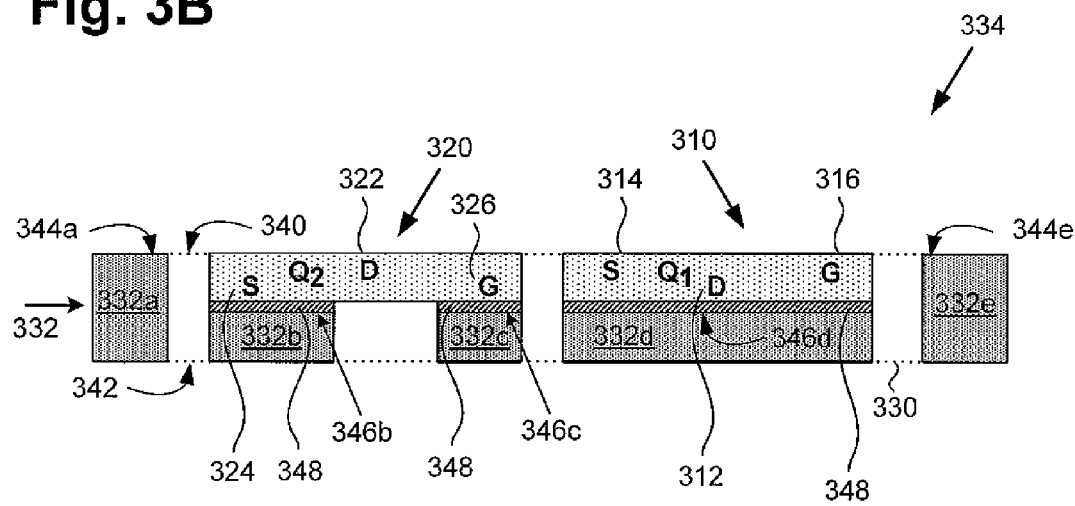
FIG. 3B illustrates a result of performing a subsequent action according to the exemplary flowchart of FIG. 2 in accordance with one implementation.

Moving to structure 334 in FIG. 3B with ongoing reference to FIG. 2, flowchart 200 continues with attaching control FET 310 ($Q_1$) and sync FET 320 ($Q_2$) to partially etched segments of first patterned conductive carrier 332 (action 234). Control FET 310 includes control drain 312, control source 314, and control gate 316, while sync FET 320 includes sync drain 322, sync source 324, and sync gate 326. As shown in FIG. 3B, control drain 312 of control FET 310 is attached to recessed surface 346d on die receiving side 340 of partially etched segment 332d of first patterned conductive carrier 332 by electrically conductive die attach material 348. As further shown in FIG. 3B, sync source 324 and sync gate 326 of sync FET 320 are attached to recessed surfaces 346b and 346c on die receiving side 340 of respective partially etched segments 332b and 332c of first patterned conductive carrier 332 by electrically conductive die attach material 348.

Electrically conductive die attach material 348 may be any suitable substance, such as a conductive epoxy, solder, a conductive sintered material, or a diffusion bonded material, formed to a thickness of approximately 10 μm or greater, for example. Control FET 310 and sync FET 320 are shown as power FETs having a vertical topology. That is to say, control source 314 and control gate 316 are situated on the same side of control FET 310, while control drain 312 is situated on an opposite side of control FET 310. Similarly, sync source 324 and sync gate 326 are situated on the same side of sync FET 320, while sync drain 322 is situated on an opposite side of sync FET 320.

In one implementation, respective control and sync FETs 310 and 320 may take the form of group IV material based vertical FETs, such as silicon vertical MOSFETs for example. However, in other implementations, respective control and sync FETs 310 and 320 may take the form of group III-V based power FETs, such as GaN or other III-Nitride based FETs. Moreover, in some implementations, respective control and sync FETs 310 and 320 may take the form of GaN or other III-Nitride based HEMTs.

It is noted that control FET 310 and sync FET 320 are flipped relative to each other. That is to say, control FET 310 is disposed on recessed surface 346d of partially etched segment 332d in a "face up" orientation in which control drain 312 is attached to recessed surface 346d, while sync FET 320 is oriented "face down" such that sync source 324 and sync gate 326 are attached to recessed surfaces 346b and 346c of respective partially etched segments 332c and 332b.

It is further noted that control and sync FETs 310 and 320 may be attached to first patterned conductive carrier 332 in any temporal order. Thus, control FET 310 may be attached to first patterned conductive carrier 332 before or after attachment of sync FET 320 to first patterned conductive carrier. Moreover, in some implementations, control and sync FETs 310 and 320 may be attached to first patterned conductive carrier 332 substantially concurrently.

Control FET 310 having control drain 312, control source 314, and control gate 316 corresponds in general to control FET 110 having drain 112, source 114, and gate 116, in FIG. 1, and may share any of the characteristics attributed to that corresponding feature in the present application. In addition, sync FET 320 having sync drain 322, sync source 324, and sync gate 326 corresponds in general to sync FET 120 having drain 122, source 124, and gate 126, in FIG. 1, and may share any of the characteristics attributed to that corresponding feature in the present application.

Figure 3C:
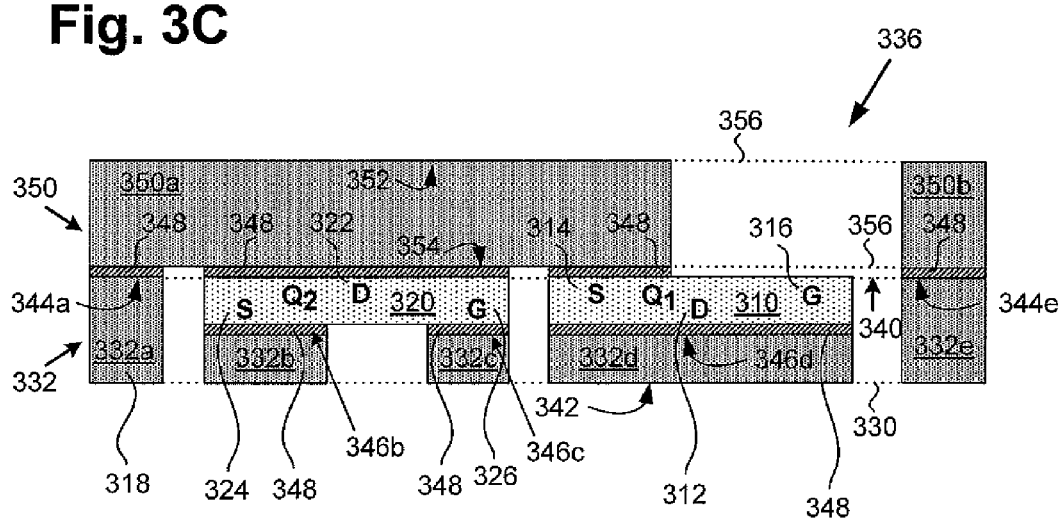
FIG. 3C illustrates a result of performing a subsequent action according to the exemplary flowchart of FIG. 2 in accordance with one implementation.

Referring to structure 336 in FIG. 3C, flowchart 200 continues with attaching second patterned conductive carrier 350 over first patterned conductive carrier 332, control FET 310, and sync FET 320 (action 236). As shown in FIG. 3C, second patterned conductive carrier 350 may be a fully patterned conductive carrier having top surface 352 and bottom surface 354, and including switch node segment 350a and output segment 350b.

As further shown in FIG. 3C, switch node segment 350a of second patterned conductive carrier 350 is attached to surface 344a of first patterned conductive carrier segment 332a, to control source 314 of control FET 310, and to sync drain 322 of sync FET 320 by electrically coupled die attach material 348. In addition, output segment 350b of second patterned conductive carrier 350 is attached to surface 344e of first patterned conductive carrier segment 332e by electrically coupled die attach material 348. According to the implementation shown in FIG. 3C, for example, switch node segment 350a and output segment 350b of second patterned conductive carrier 350 may be substantially non-etched.

Figure 3D:
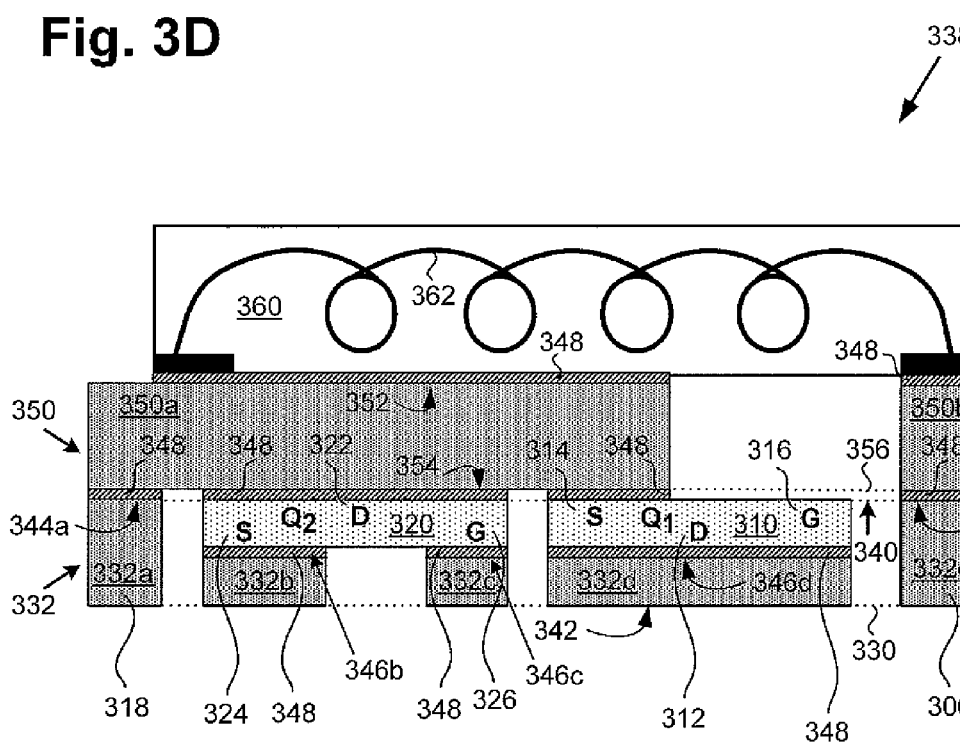
FIG. 3D illustrates a result of performing a final action according to the exemplary flowchart of FIG. 2 in accordance with one implementation.

It is noted that switch node segment 350a and output segment 350b of second patterned conductive carrier 350 are shown as connected by dashed lines 356 to indicate that the gaps between those respective segments may be visible in FIGS. 3C and 3D due to patterning of an initially contiguous conductive carrier structure providing second patterned conductive carrier 350. That is to say, second patterned conductive carrier 350 may be provided by a single conductive carrier support structure, fully patterned to provide switch node segment 350a and output segment 350b. Analogously to first patterned conductive carrier 332, second patterned conductive carrier 350 may be formed of any conductive material having a suitably low electrical resistance. Examples of materials from which second patterned conductive carrier 350 may be formed include Cu, Al, or a conductive alloy. However, in some implementations, it may be advantageous or desirable for second patterned conductive carrier 350 to be implemented as at least a portion of a semiconductor package lead frame.

As shown in FIG. 3C and noted above, switch node segment 350a of second patterned conductive carrier 350 is attached to control source 314, sync drain 322, and surface 344a of first patterned conductive carrier segment 332a using electrically conductive die attach material 348. As a result, switch node segment 350a of second patterned conductive carrier 350 is configured to electrically couple control source 314 of control FET 310 to sync drain 322 of sync FET 320, as well as to couple control source 314 and sync drain 322 to segment 332a of first patterned conductive carrier 332. Consequently, switch node segment 350a of second patterned conductive carrier 350 and segment 332a of first patterned conductive carrier 332 provide switch node contact 318. It is noted that switch node contact 318 corresponds in general to switch node 118, in FIG. 1, and may share any of the characteristics attributed to that corresponding feature in the present application.

Continuing to structure 338 in FIG. 3D, flowchart 200 may conclude with attaching output inductor 360 over top surface 352 of second patterned conductive carrier 350 (action 238). As shown in FIG. 3D, output inductor 360 may be coupled between switch node segment 350a and output segment 350b of second patterned conductive carrier 350 using electrically conductive die attach material 348.

In one implementation, output inductor 360 includes a core. The core may include a magnetic core, for example. More specifically, the core may include a high stability ferrite core. In some implementations, the core may have a cylindrical shape, a ring shape, or another suitable shape. The core may include caps, such as circular caps, at each end.

Output inductor 360 further includes winding 362. Winding 362 may include copper, or another suitable conductive material. More specifically, winding 362 may include a high temperature polyurethane copper wire. As shown in FIG. 3D, winding 362 includes a first end for coupling to switch node segment 350a of second patterned conductive carrier 350 and a second end for coupling to output segment 350b of second patterned conductive carrier 350.

Moreover, and as noted above, output segment 350b of second patterned conductive carrier 350 is attached to surface 344e of first patterned conductive carrier segment 332e by electrically conductive die attach material 348. As a result, output segment 350b of second patterned conductive carrier 350 and segment 332e of first conductive carrier 332 provide output contact 306. It is noted that output contact 306 corresponds in general to output 106 of power converter 100, in FIG. 1, and may share any of the characteristics attributed to that corresponding feature in the present application.

Figure 4A:
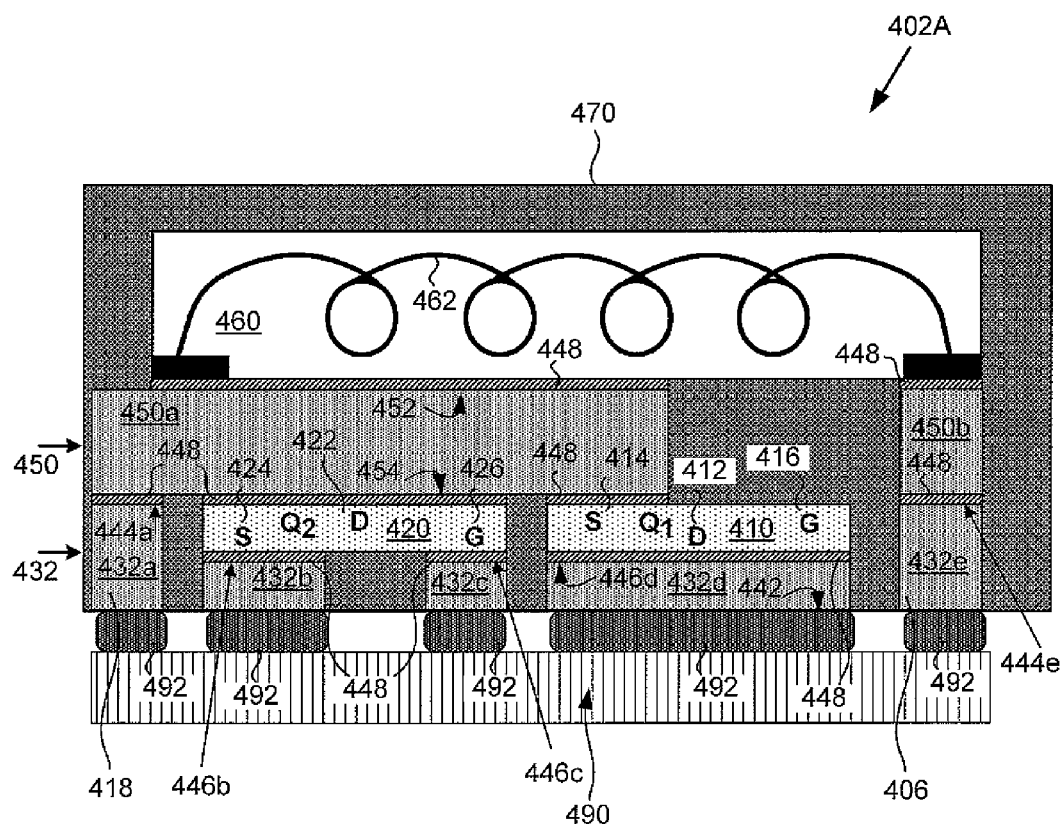
FIG. 4A shows an exemplary representation of a power converter package with integrated output inductor, according to one implementation.

Moving to FIG. 4A, FIG. 4A shows an exemplary representation of a power converter package with integrated output inductor, according to one implementation. FIG. 4A presents a cross-sectional view of semiconductor package 402A attached to mounting surface 490, which may be a printed circuit board (PCB) for example, by solder bodies 492. Semiconductor package 402A includes first patterned conductive carrier 432, which itself includes conductive carrier segments 432a, 432b, 432c, 432d, and 432e (hereinafter "segments 432a-432e"). It is noted that first patterned conductive carrier 432 includes partially etched segments 432b, 432c, and 432d, which may be half-etched, for example, as well as segments 432a and 432e, which may be substantially non-etched.

As shown in FIG. 4A, first patterned conductive carrier 432 may be a non-contiguous conductive carrier, made up of patterned and disjointed segments 432a-432e that are housed within semiconductor package 402A, and that are in electrical communication only through conductive traces and routing on or within mounting surface 490. As further shown in FIG. 4A, conductive carrier 432 has a die receiving side, and I/O side 442 opposite the die receiving side and connecting semiconductor package 402A to mounting surface 490.

Semiconductor package 402A also includes control FET 410 ($Q_1$) having control drain 412, control source 414, and control gate 416, as well as sync FET 420 ($Q_2$) having sync drain 422, sync source 424, and sync gate 426. As shown in FIG. 4A, control drain 412 of control FET 410 is attached to recessed surface 446d on the die receiving side of partially etched segment 432d by electrically conductive die attach material 448. In addition, sync source 424 and sync gate 426 of sync FET 420 are similarly attached to respective recessed surfaces 446*b* and 446*c* on the die receiving side of respective partially etched segments 432*b* and 432*c*.

Also shown in FIG. 4A is second patterned conductive carrier 450 having top surface 452 and bottom surface 454, and including switch node segment 450*a* and output segment 450*b*. Switch node segment 450*a* of second patterned conductive carrier 450 is attached to control source 414 of control FET 410, sync drain 422 of sync FET 420, and surface 444*a* on the die receiving side of first patterned conductive carrier segment 432*a* by electrically conductive die attach material 448.

Semiconductor package 402A further includes integrated output inductor 460 having winding 462, and packaging encapsulant 470. As shown in FIG. 4A, output inductor 460 is attached over top surface 452 of second patterned conductive carrier 450 and is coupled between switch node segment 450*a* and output segment 450*b* of second patterned conductive 450 using electrically conductive die attach material 448. Thus, control FET 410 and sync FET 420 are situated between first patterned conductive carrier 432 and second patterned conductive carrier 450, while second patterned conductive carrier 450 is situated between output inductor 460 and control and sync FETS 410 and 420. It is noted that packaging encapsulant 470 may be any suitable dielectric overmolding or encapsulation material typically used in semiconductor packaging, as known in the art.

As noted above, according to the implementation shown in FIG. 4A, switch node segment 450*a* of second patterned conductive carrier 450 is attached to control source 414, sync drain 422, and surface 444*a* of first patterned conductive carrier segment 432*a* using electrically conductive die attach material 448. As a result, switch node segment 450*a* of second patterned conductive carrier 450 is configured to electrically couple control source 414 of control FET 410 to sync drain 422 of sync FET 420, as well as to couple control source 414 and sync drain 422 to segment 432*a* of first patterned conductive carrier 432. Consequently, switch node segment 450*a* of second patterned conductive carrier 450 and segment 432*a* of first patterned conductive carrier 432 provide switch node contact 418 of semiconductor package 402A. Moreover, output segment 450*b* of second patterned conductive carrier 450 and segment 432*e* of first conductive carrier 432 provide output contact 406 of semiconductor package 402*b*.

Semiconductor package 402A including integrated output inductor 460 corresponds in general to output stage 102 including integrated output inductor 160, in FIG. 1, and may share any of the characteristics attributed to that corresponding feature, above. In addition, switch node contact 418 and output contact 406 correspond respectively to switch node contact 318 and output contact 306 in FIGS. 3C and 3D, and may share any of the characteristics attributed to those corresponding features, above. Moreover, first and second patterned conductive carriers 432 and 450, control FET 410, sync FET 420, and electrically conductive die attach material 448, correspond respectively in general to first and second patterned conductive carriers 332 and 350, control FET 310, sync FET 320, and electrically conductive die attach material 348, in FIGS. 3A-3D, and may share any of the characteristics attributed to those corresponding feature, above.

Figure 4B:
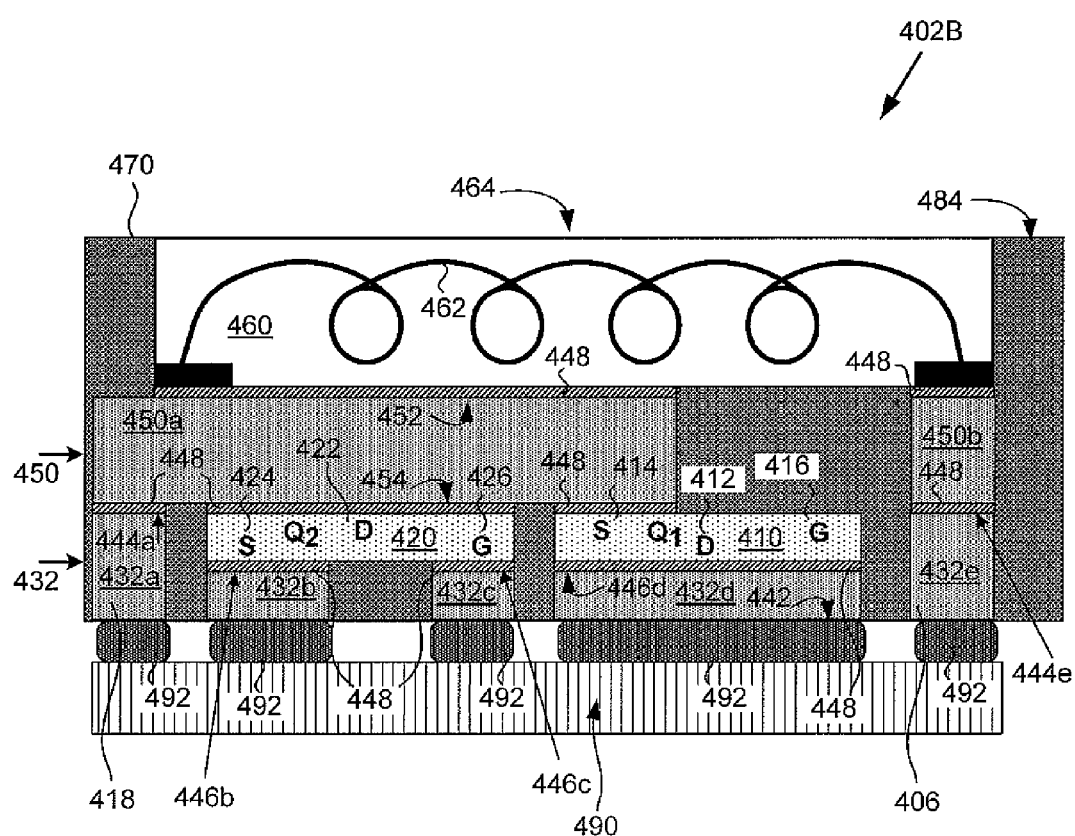
FIG. 4B shows an exemplary representation of a power converter package with integrated output inductor, according to another implementation.

Continuing to FIG. 4B, FIG. 4B shows an exemplary representation of a power converter package with integrated output inductor, according to another implementation. FIG. 4B presents a cross-sectional view of semiconductor package 402B attached to mounting surface 490 by solder bodies 492. It is noted that all features in FIG. 4B identified by reference numbers shown in and described by reference to FIG. 4A, above, correspond respectively to those features and may share any of the characteristics attributed to those corresponding features in the present application.

In contrast to the exemplary packaging solution shown in FIG. 4A, however, top surface 464 of output inductor 460 is exposed through packaging encapsulant 470 at top surface 484 of semiconductor package 402B. In some implementations, exposure of top surface 464 of output inductor 460 at top surface 484 of semiconductor package 402B may result in improved thermal performance by semiconductor package 402B.

Figure 4C:
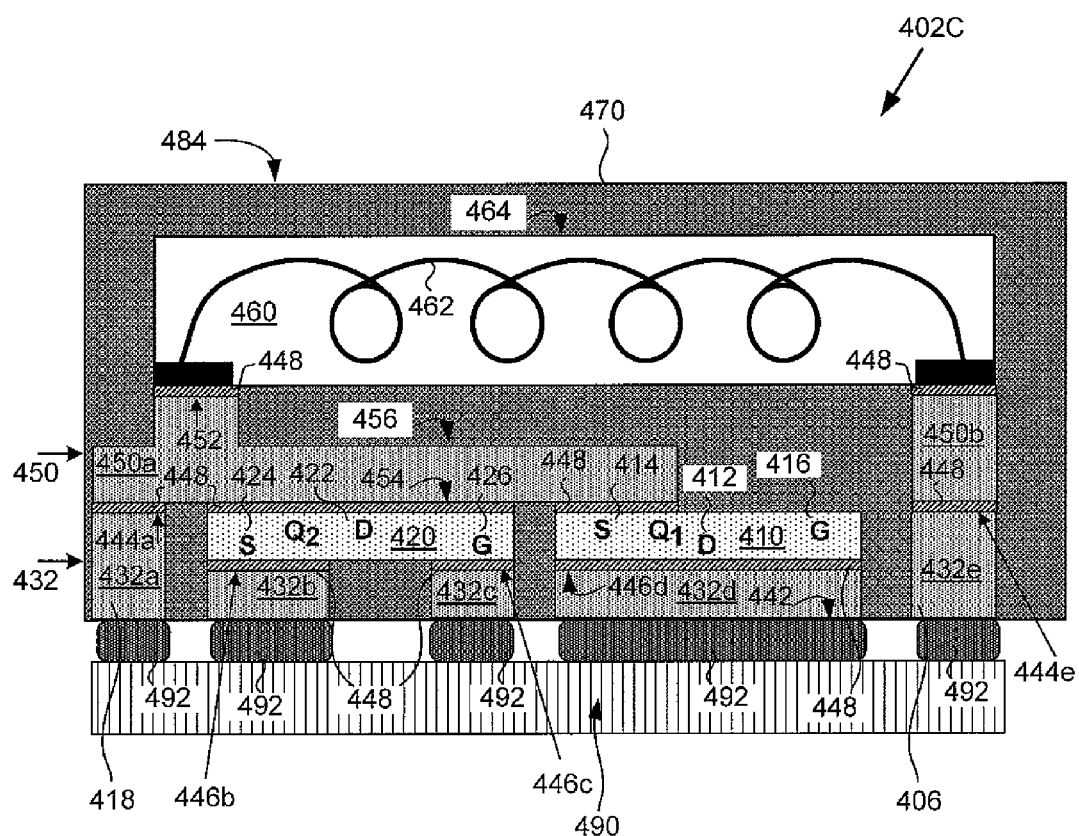
FIG. 4C shows an exemplary representation of a power converter package with integrated output inductor, according to another implementation.

Referring to FIG. 4C, FIG. 4C shows an exemplary representation of a power converter package with integrated output inductor, according to another implementation. FIG. 4C presents a cross-sectional view of semiconductor package 402C attached to mounting surface 490 by solder bodies 492. It is noted that all features in FIG. 4C identified by reference numbers shown in and described by reference to FIG. 4A and FIG. 4B, above, correspond respectively to those features and may share any of the characteristics attributed to those corresponding features in the present application.

In contrast to semiconductor packages 402A and 402B, in respective FIGS. 4A and 4B, however, semiconductor package 402C includes second patterned conductive carrier 450 having partially etched switch node segment 450*a*. That is to say, a portion of switch node segment 450*a* is partially etched, such as by being half-etched, to provide recessed surface 456 opposite bottom surface 454.

It is noted that, according to the implementation shown in FIG. 4C, output inductor 460 may be coupled to top surface 452 of switch node segment 450*a* at a portion of switch node segment 450*a* that is substantially non-etched. It is further noted that semiconductor package 402C may be adapted analogously to semiconductor package 402B, in FIG. 4B, through exposure of top surface 464 of output inductor 460 at top surface 484 of semiconductor package 402C.

Figure 5:
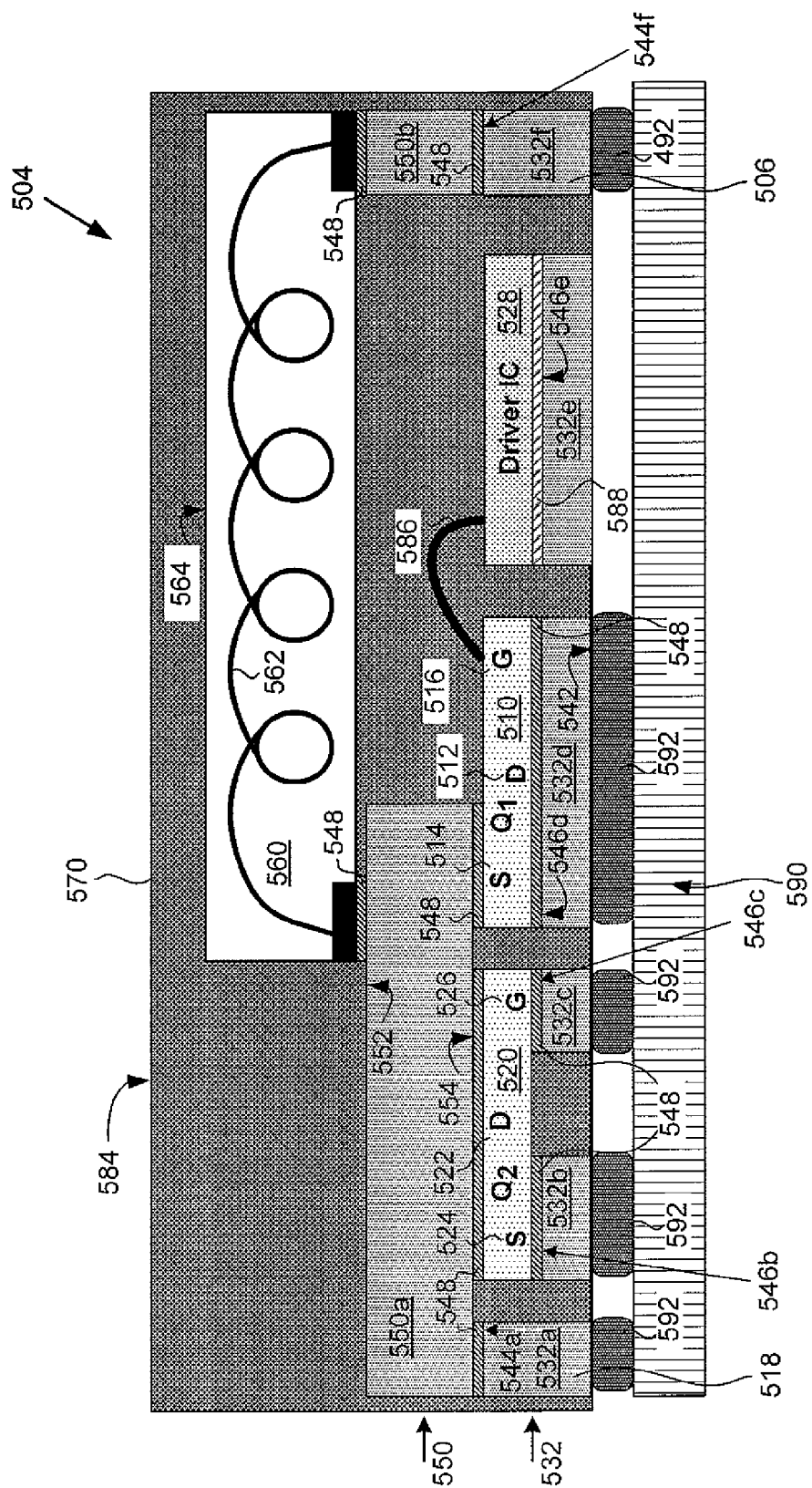
FIG. 5 shows an exemplary representation of a power converter package with integrated output inductor, according to yet another implementation.

The implementations shown and described by reference to FIGS. 4A-4C result in respective semiconductor packages 402A-402C configured to enclose output stage 102, in FIG. 1. However, in some applications, it may be advantageous or desirable to produce a semiconductor package corresponding to power converter package 104. An example implementation of such a semiconductor package is shown by FIG. 5. One of ordinary skill in the art will readily understand that the exemplary method outlined by flowchart 200, in FIG. 2, can be suitably adapted to produce the exemplary semiconductor package shown in FIG. 5.

FIG. 5 shows a cross-sectional view of semiconductor package 504 attached to mounting surface 590, which may be a PCB for example, by solder bodies 592. Semiconductor package 504 includes first patterned conductive carrier 532, which itself includes conductive carrier segments 532*a*, 532*b*, 532*c*, 532*d*, 532*e*, and 532*f* (hereinafter "segments 532*a*-532*f*"). It is noted that first patterned conductive carrier 532 includes partially etched segments 532*b*, 532*c*, 532*d*, and 532*e*, which may be half-etched, for example, as well as segments 532*a* and 532*f*, which may be substantially non-etched.

As shown in FIG. 5, first patterned conductive carrier 532 may be a non-contiguous conductive carrier, made up of patterned and disjointed segments 532*a*-532*f* that are housed within semiconductor package 504, and that are in electrical communication only through conductive traces and routing on or within mounting surface 590. As further shown in FIG. 5, first patterned conductive carrier 532 has a die receiving side, and I/O side 542 opposite the die receiving side and connecting semiconductor package 504 to mounting surface 590.

Semiconductor package 504 includes control FET 510 ($Q_1$) having control drain 512, control source 514, and control gate 516, as well as sync FET 520 ($Q_2$) having sync drain 522, sync source 524, and sync gate 526. As shown in FIG. 5, control drain 512 of control FET 510 is attached to recessed surface 546*d* on the die receiving side of partially etched segment 532*d* by electrically conductive die attach material 548. In addition, sync source 524 and sync gate 526 of sync FET 520 are similarly attached to respective recessed surfaces 546*b* and 546*c* on the die receiving side of respective partially etched segments 532*b* and 532*c*.

Semiconductor package 504 also includes driver IC 528 for driving at least one of control FET 510 and sync FET 520. In addition, FIG. 5 shows one or more wire bonds 586 coupling control gate 516 of control FET 510 to driver IC 528, and die attach material 588. It is noted that die attach material 588, which may be an electrically conductive die attach material or a dielectric die attach material, is used to attach driver IC 528 to recessed surface 546*e* on the die receiving side of partially etched segment 532*e* of first patterned conductive carrier 532. It is further noted that although electrical connection of control gate 516 to driver IC 528 is depicted as being provided by one or more wire bonds 586 in FIG. 5, that representation is merely for the purposes of conceptual clarity. More generally, the electrical connection represented by one or more wire bonds 586 may be implemented using conductive clips, ribbons, or strips, for example.

Also shown in FIG. 5 is second patterned conductive carrier 550 having top surface 552 and bottom surface 554, and including switch node segment 550*a* and output segment 550*b*. Switch node segment 550*a* of second patterned conductive carrier 550 is attached to control source 514 of control FET 510, sync drain 522 of sync FET 520, and surface 544*a* on the die receiving side of first patterned conductive carrier segment 532*a* by electrically conductive die attach material 548. Output segment 550*b* of second patterned conductive carrier 550 is attached to segment 532*f* of first patterned conductive carrier 532 by electrically conductive die attach material 548.

Semiconductor package 504 further includes integrated output inductor 560 having winding 562, and packaging encapsulant 570. As shown in FIG. 5, output inductor 560 is attached over top surface 552 of second patterned conductive carrier 550 and is coupled between switch node segment 550*a* and output segment 550*b* of second patterned conductive 550 using electrically conductive die attach material 548. Thus, control FET 510, sync FET 520, and driver IC 528 are situated between first patterned conductive carrier 532 and second patterned conductive carrier 550, while second patterned conductive carrier 550 is situated between output inductor 560 and control FET 510, sync FET 520, and driver IC 528. Also shown in FIG. 5 are top surface 564 of output inductor 560 and top surface 584 of semiconductor package 504.

As noted above, according to the implementation shown in FIG. 5, switch node segment 550*a* of second patterned conductive carrier 550 is attached to control source 514, sync drain 522, and surface 544*a* of first patterned conductive carrier segment 532*a* using electrically conductive die attach material 548. As a result, switch node segment 550*a* of second patterned conductive carrier 550 is configured to electrically couple control source 514 of control FET 510 to sync drain 522 of sync FET 520, as well as to couple control source 514 and sync drain 522 to segment 532*a* of first patterned conductive carrier 532. Consequently, switch node segment 550*a* of second patterned conductive carrier 550 and segment 532*a* of first patterned conductive carrier 532 provide switch node contact 518 of semiconductor package 504. Moreover, output segment 550*b* of second patterned conductive carrier 550 and segment 532*f* of first conductive carrier 532 provide output contact 506 of semiconductor package 504.

Semiconductor package 504 including integrated output inductor 560 corresponds in general to power converter package 104 including integrated output inductor 160, in FIG. 1, and may share any of the characteristics attributed to that corresponding feature, above. In addition, switch node contact 518 and output contact 506, in FIG. 5, correspond respectively to switch node contact 418 and output contact 406 in FIGS. 4A-4C, and may share any of the characteristics attributed to those corresponding features, above.

Moreover, first and second patterned conductive carriers 532 and 550, control FET 510, and sync FET 520 correspond respectively in general to first and second patterned conductive carriers 432 and 450, control FET 410, and sync FET 420, in FIGS. 4A-4C, and may share any of the characteristics attributed to those corresponding feature, above. In other words, first patterned conductive carrier 532 and/or second patterned conductive carrier 550 may each be implemented using at least a portion of a semiconductor package lead frame. Furthermore, electrically conductive die attach material 548 and packaging encapsulant 570, in FIG. 5, correspond respectively in general to electrically conductive die attach material 448 and packaging encapsulant 470, in FIGS. 4A-4C, and may share any of the characteristics attributed to those corresponding features, above.

It is noted that exemplary semiconductor package 504 may be readily adapted to include the alternative features shown in FIGS. 4B and 4C. In other words, in some implementations, top surface 564 of output capacitor may be exposed at top surface 584 of semiconductor package 504, and/or switch node segment 550*a* of second patterned conductive carrier 550 may be partially etched, as described above.

Thus, the present application discloses a packaging solution with integrated output inductor that provides a highly compact design for packaging a power converter, such as a voltage regulator. By coupling the output inductor between a switch node segment and an output segment of a patterned conductive carrier attached over control and sync FETs, the implementations disclosed herein enable a substantial reduction in PCB surface area required to implement the power converter.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
    a first patterned conductive carrier;
    a control field-effect transistor (FET) having a control drain attached to a first partially etched segment of said first patterned conductive carrier;
    a synchronous (sync) FET having a sync source and a sync gate attached to respective second and third partially etched segments of said first patterned conductive carrier;
    a second patterned conductive carrier having a switch node segment situated over a control source of said control FET and over a sync drain of said sync FET; and
    an inductor coupled between said switch node segment and an output segment of said second patterned conductive carrier.

2. The semiconductor package of claim 1, wherein said first, second, and third partially etched segments of said first patterned conductive carrier are substantially half-etched.

3. The semiconductor package of claim 1, wherein said switch node segment of said second patterned conductive carrier is partially etched.

4. The semiconductor package of claim 1, wherein said control FET, said sync FET, and said inductor form an output stage of a power converter.

5. The semiconductor package of claim 1, wherein at least one of said first patterned conductive carrier and said second patterned conductive carrier comprises at least a portion of a lead frame.

6. The semiconductor package of claim 1, wherein said second patterned conductive carrier comprises at least a portion of a lead frame.

7. The semiconductor package of claim 1, wherein said control FET and said sync FET comprise silicon power FETs.

8. The semiconductor package of claim 1, wherein said control FET and said sync FET comprise group III-Nitride FETs.

9. The semiconductor package of claim 1, wherein said control FET and said sync FET comprise group III-Nitride high electron mobility transistors (HEMTs).

10. The semiconductor package of claim 1, further comprising a driver integrated circuit for driving at least one of said control FET and said sync FET.

11. A semiconductor package comprising:
    a first patterned conductive carrier;
    a control field-effect transistor (FET) having a control drain attached to a first partially etched segment of said first patterned conductive carrier;
    a synchronous (sync) FET having a sync source and a sync gate;
    a second patterned conductive carrier having a switch node segment situated over a control source of said control FET and over a sync drain of said sync FET; and
    an inductor coupled between said switch node segment and an output segment of said second patterned conductive carrier.

12. The semiconductor package of claim 11, wherein said switch node segment of said second patterned conductive carrier is partially etched.

13. The semiconductor package of claim 11, wherein said control FET, said sync FET, and said inductor form an output stage of a power converter.

14. The semiconductor package of claim 11, wherein at least one of said first patterned conductive carrier and said second patterned conductive carrier comprises at least a portion of a lead frame.

15. The semiconductor package of claim 11, wherein said second patterned conductive carrier comprises at least a portion of a lead frame.

16. The semiconductor package of claim 11, wherein said control FET and said sync FET comprise silicon power FETs.

17. The semiconductor package of claim 11, wherein said control FET and said sync FET comprise group III-Nitride FETs.

18. The semiconductor package of claim 11, wherein said control FET and said sync FET comprise group III-Nitride high electron mobility transistors (HEMTs).

19. The semiconductor package of claim 11, further comprising a driver integrated circuit for driving at least one of said control FET and said sync FET.

* * * * *